(12) United States Patent
Sano

(10) Patent No.: US 10,379,302 B2
(45) Date of Patent: Aug. 13, 2019

(54) METHOD OF MANUFACTURING PHOTOELECTRIC CONVERSION CONNECTORS, AS WELL AS PHOTOELECTRIC CONVERSION CONNECTOR AND PHOTOELECTRIC CONVERSION CONNECTOR DEVICE UTILIZING SAME

(71) Applicant: Hirose Electric Co., Ltd., Tokyo (JP)

(72) Inventor: Yoshiaki Sano, Tokyo (JP)

(73) Assignee: HIROSE ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/676,814

(22) Filed: Aug. 14, 2017

(65) Prior Publication Data

US 2018/0059341 A1  Mar. 1, 2018

(30) Foreign Application Priority Data

Sep. 1, 2016  (JP) ................................. 2016-170896

(51) Int. Cl.
*G02B 6/42* (2006.01)
*H01L 31/02* (2006.01)
(Continued)

(52) U.S. Cl.
CPC ......... *G02B 6/4253* (2013.01); *G02B 6/4214* (2013.01); *G02B 6/4257* (2013.01);
(Continued)

(58) Field of Classification Search
CPC .. G02B 6/4253; G02B 6/4214; G02B 6/4257; G02B 6/4274; G02B 6/4292;
(Continued)

(56) References Cited

U.S. PATENT DOCUMENTS 8,961,039 B2 *  2/2015  Sano .................... H01R 12/716
                                                            385/89
9,869,834 B2 *  1/2018  Sano .................... G02B 6/4255
(Continued)

FOREIGN PATENT DOCUMENTS

JP           2012177732 A       9/2012

*Primary Examiner* — Thomas A Hollweg
*Assistant Examiner* — Mary A El-Shammaa
(74) *Attorney, Agent, or Firm* — Procopio, Cory, Hargreaves & Savitch LLP

(57) ABSTRACT

The following steps are provided: encapsulating a series of connector components arranged in a column direction among multiple connector components on a support member that are arranged in each direction, respectively, in a row direction and in a column direction, in a state of substantial isolation from connector components adjacent to the series of connector components in the row direction using a first resin member; dicing the multiple connector components on the support member encapsulated using the first resin member into row units in the row direction; molding the multiple connector components on the support member, which have been encapsulated using the above-mentioned first resin member and diced, using a second resin member on a column-by-column basis; and dicing off the multiple molded connector components on the support member in the column direction one by one.

8 Claims, 12 Drawing Sheets

(51) Int. Cl.
*H01L 31/0203* (2014.01)
*H01L 31/173* (2006.01)
*H01L 31/18* (2006.01)
*H01L 31/16* (2006.01)

(52) U.S. Cl.
CPC ......... *G02B 6/4274* (2013.01); *G02B 6/4292* (2013.01); *G02B 6/4295* (2013.01); *H01L 31/0203* (2013.01); *H01L 31/02005* (2013.01); *H01L 31/16* (2013.01); *H01L 31/173* (2013.01); *H01L 31/1876* (2013.01); *Y02P 70/521* (2015.11)

(58) Field of Classification Search
CPC ............ G02B 6/4295; H01L 31/02005; H01L 31/0203; H01L 31/173; H01L 31/1876
USPC .......................................................... 385/89
See application file for complete search history.

(56) References Cited

U.S. PATENT DOCUMENTS

| | | | | |
|---|---|---|---|---|
| 9,874,707 | B2* | 1/2018 | Sano | G02B 6/4255 |
| 2006/0270283 | A1* | 11/2006 | Kumazawa | G02B 6/3897 |
| | | | | 439/676 |
| 2007/0258683 | A1* | 11/2007 | Rolston | G02B 6/4232 |
| | | | | 385/88 |
| 2009/0245737 | A1* | 10/2009 | Fujiwara | G02B 6/4292 |
| | | | | 385/92 |
| 2013/0343711 | A1* | 12/2013 | Sano | H01R 12/716 |
| | | | | 385/88 |
| 2014/0041214 | A1* | 2/2014 | Barlow | H05K 3/0052 |
| | | | | 29/841 |
| 2014/0239179 | A1* | 8/2014 | Novotny | G01J 5/20 |
| | | | | 250/338.4 |
| 2016/0299302 | A1* | 10/2016 | Sano | G02B 6/4255 |

* cited by examiner

METHOD OF MANUFACTURING PHOTOELECTRIC CONVERSION CONNECTORS, AS WELL AS PHOTOELECTRIC CONVERSION CONNECTOR AND PHOTOELECTRIC CONVERSION CONNECTOR DEVICE UTILIZING SAME

CROSS REFERENCE TO RELATED APPLICATIONS

This Paris Convention Patent Application claims benefit under 35 U.S.C. §119 and claims priority to Japanese Patent Application No. JP 2016-170896, filed on Sep. 1, 2016, the content of which is incorporated herein in its entirety by reference for all purposes.

BACKGROUND

Technical Field

The present invention relates to a method of manufacturing photoelectric conversion connectors, as well as to a photoelectric conversion connector and a photoelectric conversion connector device utilizing the same.

Background Art

A method for manufacturing a conventional photoelectric conversion connector device and an exemplary photoelectric conversion connector device are described in Patent Document 1. Such a conventional photoelectric conversion connector device primarily includes: a support member; a light-receiving element and an actuation device provided on this support member; multiple terminals connected to the actuation device; a first resin member integrally molded with the light-receiving element, actuation device, support member, terminals, and the like; and a second resin member integrally molded with the external surface of this first resin member.

Among these components of photoelectric conversion connector devices, the support member and terminals are formed using a planar metal lead frame that extends in a single column in one direction, and multiple connector components considered necessary in the manufacture of photoelectric conversion connector devices, such as light-receiving elements, actuation devices, and the like, are disposed in a single column in one direction on this lead frame. Therefore, multiple photoelectric conversion connector devices can be manufactured using a single lead frame.

PRIOR ART DOCUMENTS

Patent Documents

Patent Document 1:
Japanese Patent Application No. 2012-177732

SUMMARY

Problem to be Solved by the Invention

In the case of conventional photoelectric conversion connector devices, multiple photoelectric conversion connector devices can be manufactured using a single lead frame. However, this was not suitable for mass production because in said lead frame, the connector components were arranged in a single column in one direction only.

The present invention was devised in order to eliminate such prior-art problems and it is an object of the present invention to, in addition to providing a manufacturing method suitable for the mass production of photoelectric conversion connectors, provide a photoelectric conversion connector obtained using this manufacturing method and a photoelectric conversion connector device utilizing the same.

Means for Solving the Problem

It is an object of the invention to provide a manufacturing method suitable for the mass production of photoelectric conversion connectors and, in addition, provide a photoelectric conversion connector obtained using this manufacturing method.

In order to solve the above-mentioned problems, a method of manufacturing photoelectric conversion connectors according to one mode of the present invention comprises the steps of: encapsulating a series of connector components arranged in a column direction among multiple connector components on a support member that are arranged in each direction, respectively, in a row direction and in a column direction, in a state of substantial isolation from connector components adjacent to said series of connector components in the row direction using a first resin member; dicing the multiple connector components on the support member encapsulated using the above-mentioned first resin member into row units in the row direction; molding the multiple connector components on the support member, which have been encapsulated using the above-mentioned first resin member and diced, using a second resin member on a column-by-column basis; and dicing off the multiple molded connector components on the support member in the column direction one by one.

According to the manufacturing method of this mode, multiple photoelectric conversion connectors can be mass produced at one time because processing is performed in a state in which multiple connector components are arranged both in the row and column directions. In addition, for example, if a thermosetting resin is used for the first resin member, there is a risk that warping may occur in the support member upon cooling because of the coefficient of contraction, and when a series of connector components arranged in the column direction, as in this configuration, are encapsulated at one time, the effect becomes particularly pronounced. However, as a result of encapsulating this series of connector components in a state of substantial mutual isolation from adjacent connector components in the row direction, even when the support member is later diced into row units, it is possible to reduce the likelihood of warping being generated in the support members of the row units produced by dicing or the magnitude of the resultant warping.

According to the manufacturing method of this mode, the encapsulation step is preferably performed by encapsulating, at one time, the series of connector components and connector components adjacent to said series of connector components in the row direction using the first resin member.

In accordance with the method of manufacturing photoelectric conversion connectors of this mode, encapsulating all the connector components adjacent in the row direction at one time can improve the efficiency of the manufacturing process.

In the manufacturing method of the above-described mode, the first resin member may be made of thermosetting resin and said first resin member may be encapsulated using transfer molding.

Using transfer molding instead of injection molding can reduce the load applied to the connector components during the encapsulation of the first resin member.

In the manufacturing method of the above-mentioned mode, the second resin member is preferably integrally molded.

Integral molding can simplify the manufacturing process. In addition, the strength of the manufactured connectors can be increased.

In the manufacturing method of the above-mentioned mode, the encapsulation with the first resin member is also preferably performed with respect to peripheral components, which are located between the series of connector components arranged in the column direction and connector components adjacent to said series of connector components in the row direction and which are not included among said connector components.

According to the method of manufacturing photoelectric conversion connectors of this mode, peripheral components other than the connector components, such as wiring patterns and the like, can also be molded using the first resin member to reduce the risk of the wiring patterns peeling off the support member when the support member is diced, etc.

In the manufacturing method of the above-mentioned mode, the support member preferably has provided therein at least two openings mutually spaced apart in the row direction.

The method of manufacturing photoelectric conversion connectors of this mode can simplify the manufacturing process because the encapsulation position of the first resin member and the molding position of the second resin member relative to the support member can be determined using these openings provided in the support member. In addition, the support member can be transported using these openings during machine production.

In the manufacturing method of the above-mentioned mode, at least two such openings are preferably included in each of the support members produced by dicing into row units in the row direction.

Providing the openings in each of the support members produced by dicing in the row direction can make it easier to work with each of the support members produced by dicing.

A photoelectric conversion connector according to one mode of the present invention is provided with: a support member supporting connector components, which include an optical semiconductor device used to convert optical signals and electrical signals and a wiring pattern electrically connected to said optical semiconductor device; a first resin member encapsulating the connector components; and a second resin member used for molding onto the connector components encapsulated by the above-mentioned first resin member; wherein the second resin member has a waveguide supporting portion that supports an optical waveguide member used to transmit optical signals and a reflective surface that reflects optical signals and changes their optical path, thereby transmitting optical signals between the optical waveguide member and the optical semiconductor device, and the wiring pattern is exposed on at least a portion of a circumferential face formed by the support member and the first resin member.

In the photoelectric conversion connector of the above-mentioned mode, the support member may have contact connecting portions on the surface opposite to the surface that supports the connector components.

A photoelectric conversion connector device may be configured by further providing a contact member in the photoelectric conversion connector of the above-mentioned mode. In addition, a shell may be further provided to cover the external surface of the photoelectric conversion connector device.

Effects of the Invention

The invention of this Application provides a manufacturing method suitable for the mass production of photoelectric conversion connectors, and, in addition, provides a photoelectric conversion connector obtained using such a manufacturing method and a photoelectric conversion connector device utilizing the same.

DETAILED DESCRIPTION

A preferred embodiment of the present invention will be described below while referring to the accompanying drawings. It should be noted that although only the preferred embodiment is illustrated here for convenience, quite naturally, this is not intended to limit the present invention in any way.

Figure 1:
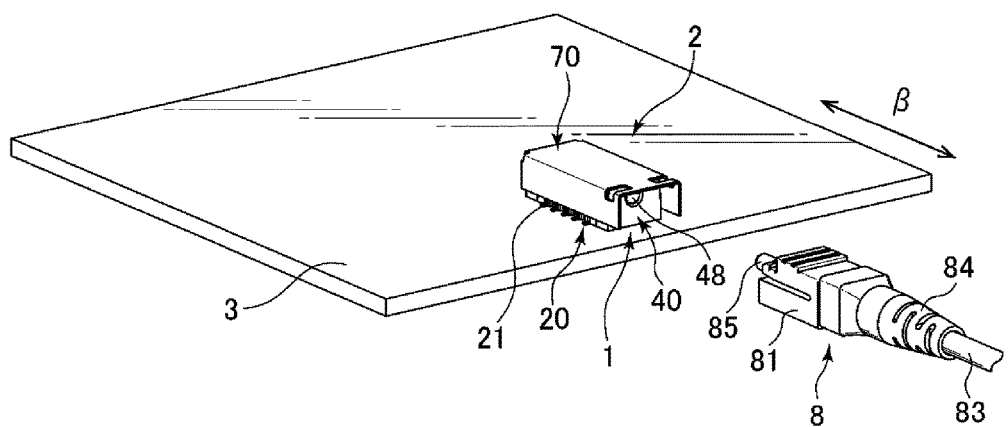
FIG. 1 illustrates an oblique view illustrating a photoelectric conversion connector device according to the present invention along with a counterpart connector.

In FIG. 1, the inventive photoelectric conversion connector device 2 is shown in an oblique view along with a counterpart connector 8 that can be mated and disengaged therefrom. The photoelectric conversion connector device 2 and counterpart connector 8 can be mated and disengaged from one another in the direction of arrow "β" shown in the figure. The photoelectric conversion connector device 2 can be used, for example, as a board-connected type connector installed on a circuit board 3 by means of contacts 21, and the counterpart connector 8 can be used, for example, as a cable-connected type connector used by connecting it to a fiber-optic cable 83. Quite naturally, they are not limited to such modes of use.

The counterpart connector 8 may be a general-purpose optical fiber connector. Behind the main body 81 of the counterpart connector 8, there is provided a fiber-optic cable 83, which is an optical waveguide member used to transmit optical signals. A portion of the fiber-optic cable 83 may be covered by a hood 84. A ferrule 85, which supports the fiber-optic wire of the fiber-optic cable 83, is provided in a forwardly protruding configuration in front of the main body 81.

When the counterpart connector 8 and the photoelectric conversion connector device 2 are mated, the front face of the counterpart connector 8 and the front face of the photoelectric conversion connector device 2 abut and the ferrule 85 provided in the counterpart connector 8 is inserted through an access hole 48, which is a waveguide supporting portion provided on the front face of the photoelectric conversion connector device 2. As a result, the fiber-optic cable 83 is supported in a predetermined location of the photoelectric conversion connector device 2.

Figure 2:
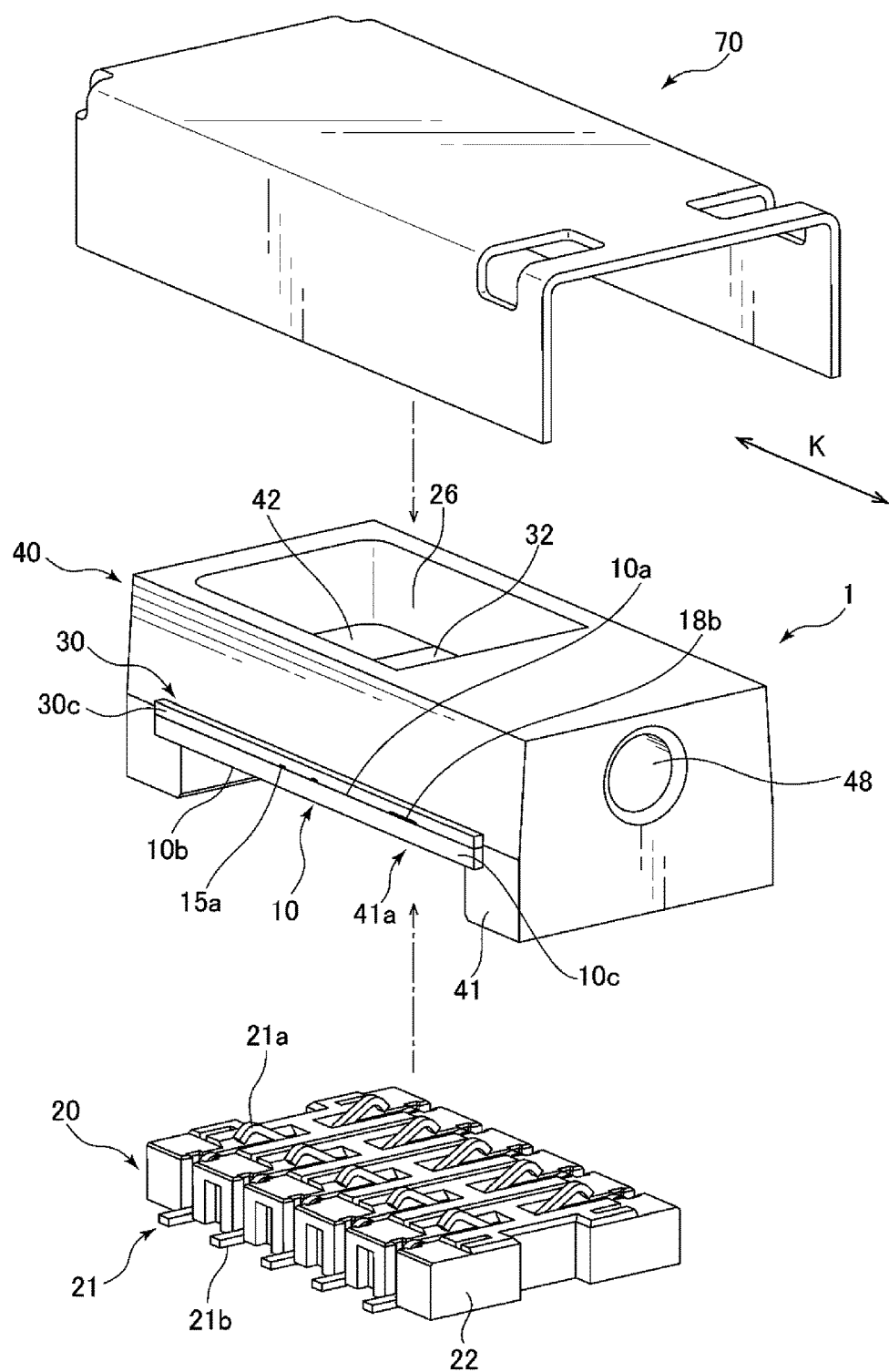
FIG. 2 illustrates an exploded oblique view of the photoelectric conversion connector device.

FIG. 2 is an exploded oblique view of the photoelectric conversion connector device 2. The photoelectric conversion connector device 2 is provided with a photoelectric conversion connector 1 and a contact member 20 provided in a detachable manner relative to this photoelectric conversion connector 1. The photoelectric conversion connector device 2 may further have a metal shell 70 covering the external surfaces of the photoelectric conversion connector 1 and the contact member 20.

The contact member 20 is provided with a flattened substantially rectangular housing 22 and multiple contacts 21 secured in place by this housing 22. The contact member 20, which is disposed between the photoelectric conversion connector 1 and the board 3, operates to connect predetermined sections of the photoelectric conversion connector 1 and the board 3 (see FIG. 1) by means of the contacts 21. Resilient contact portions 21a are formed at the distal ends of the contacts 21 for connecting to the predetermined sections of the photoelectric conversion connector 1. The rear ends of the contacts 21 are used as board connection portions 21b.

The shell 70 covers a portion of the photoelectric conversion connector 1 and contact member 20 (i.e., their external surfaces with the exception of their bottom faces and rear faces). The shell 70 is not necessarily indispensable. For example, an embodiment may be used in which a shell (not shown in the drawing) is provided in the counterpart connector 8 instead of the shell 70, such that the photoelectric conversion connector device 2 is contained within the counterpart connector 8 and the photoelectric conversion connector 1 is substantially covered by the shell.

The photoelectric conversion connector 1 is primarily made up of a support member 10 that supports the connector components, a resin member 30 that encapsulates the connector components, and a resin member 40 molded onto the connector components encapsulated by the resin member 30.

Figure 3A:
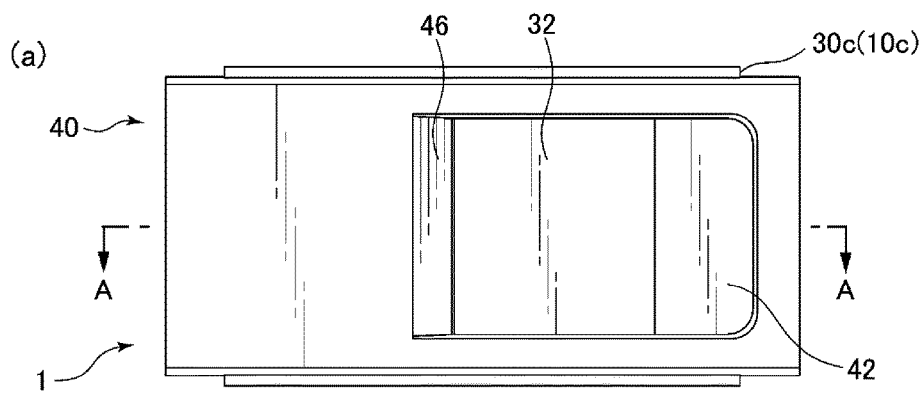
FIGS. 3(a) to 3(c) illustrate a photoelectric conversion connector.
Figure 3B:
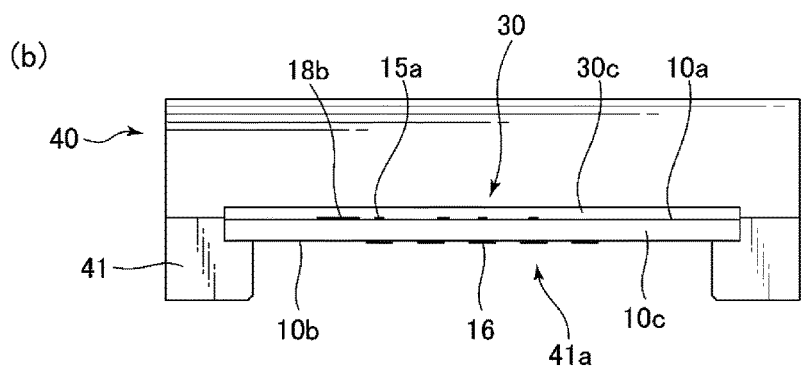
Figure 3C:
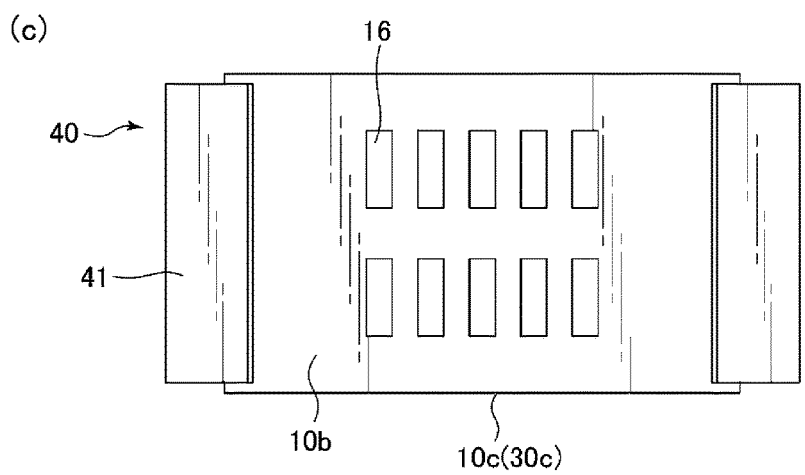
Figure 4:
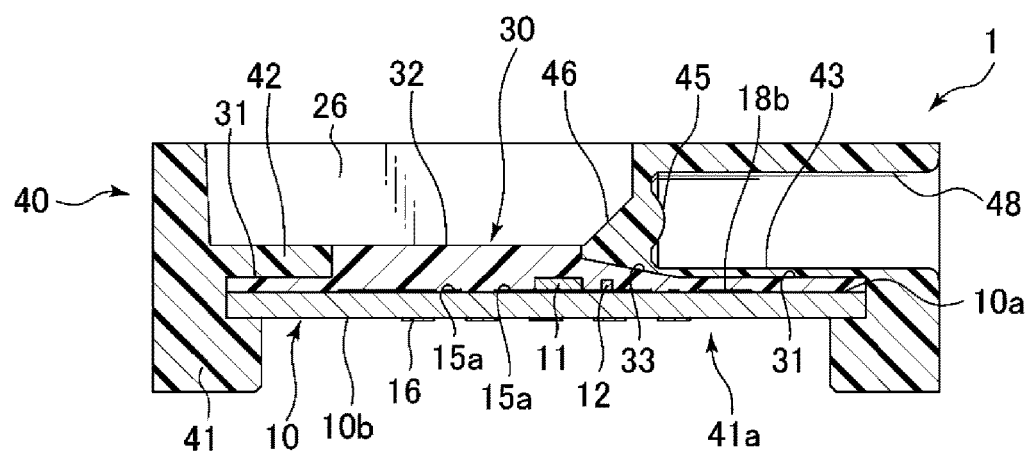
FIG. 4 illustrates a cross-sectional view taken along line A-A in FIG. 3(a).

FIGS. 3(a) to 3(c) and FIG. 4 show individual aspect views of the photoelectric conversion connector 1. FIG. 3(a) is a plan view of the photoelectric conversion connector 1, FIG. 3(b) its front view, FIG. 3(c) its bottom face view, and FIG. 4 is a cross-sectional view taken along line A-A in FIG. 3(a).

The connector components are placed on the face 10a of the support member 10. The connector components include, for example, an optical semiconductor device 12 used to convert optical signals and electrical signals, various circuit elements, such as an actuation device 11 used to drive the semiconductor device, as well as some of the wiring patterns. In view of the dicing step that forms part of the hereinafter-described manufacturing method, portions of the wiring patterns 15a, 18b are exposed on at least a portion of the circumferential faces formed by the support member 10 and the resin member 30, for example, on the lateral end faces 10c and 30c. Some of the exposed wiring patterns, for example, the wiring patterns 15a, may be electrically connected to the circuit elements. Multiple contact connecting portions 16 are provided on the other face 10b, which is opposite to the face 10a of the support member 10. The contact connecting portions 16 may be formed using pads.

The resin member 30 is formed by molding, for example, on top of the connector components supported by the support member 10, in order to encapsulate these connector components. Due to the fact that a light-transmitting optical resin is used for the resin member 30, optical signals can be transmitted through the resin member 30. The resin member 30, in its cross-section, includes thin layer sections 31 positioned on the front and rear side, a thick layer section 32 positioned approximately centrally, and, furthermore, a tapered section 33 that unites the thin layer section 31 and the thick layer section 32. The actuation device 11 and optical semiconductor device 12 are buried in the thick layer section 32 and tapered section 33.

The resin member 40 is molded onto the connector components encapsulated by the resin member 30 and, for example, covers a portion of the upper face of the resin member 30 and the front and rear lateral faces of the resin member 30 and support member 10. By thus molding the resin member 40, an access hole 48 used to support the fiber-optic cable 83 (in particular, the ferrule 85 attached to its distal end) is formed, and there are means for condensing and spreading optical signals (for example, a lens 45) as well as a reflective surface 46 that transmits optical signals between the access hole 48 and optical semiconductor device 12 by reflecting the optical signals and changing the optical path. Furthermore, the resin member 40 has legs 41 formed on the front and rear side along the mating/disengagement direction "β". These legs 41 form a space 41a on the other face 10b, which is opposite to the face 10a of the support member 10, such that the contact member 20 can be installed in this space 41a. The contact member 20 disposed in the space 41a faces the other face 10b of the support member 10, on which the contact connecting portions 16 are provided, as a result of which the resilient contact portions 21a of the contacts 21 provided in the contact member 20 are connected to the contact connecting portions 16 provided on the other face 10b of the support member. The connector components on the support member 10 are electrically connected to the board 3 by means of this contact. It is preferable to use non-crystalline resin for the resin member 40. This is due to the fact that making it non-crystalline provides for excellent permeability due to the wavelength of the optical signals emitted from the optical semiconductor device 12. In addition, in the same manner as the resin member 30, the resin member 40 is preferably formed from a light-transmitting resin. This makes it possible to transmit optical signals through the resin member 40. For example, polyetherimide (PEI), polyethersulfone (PESU), polyphenylsulfone (PPSU) and other resins can be used. Furthermore, the resin member 40 preferably has the same or substantially the same refractive index as the resin member 30. This makes it possible to prevent optical signal misregistration at the boundary of the resin member 30 and resin member 40.

Figure 5:
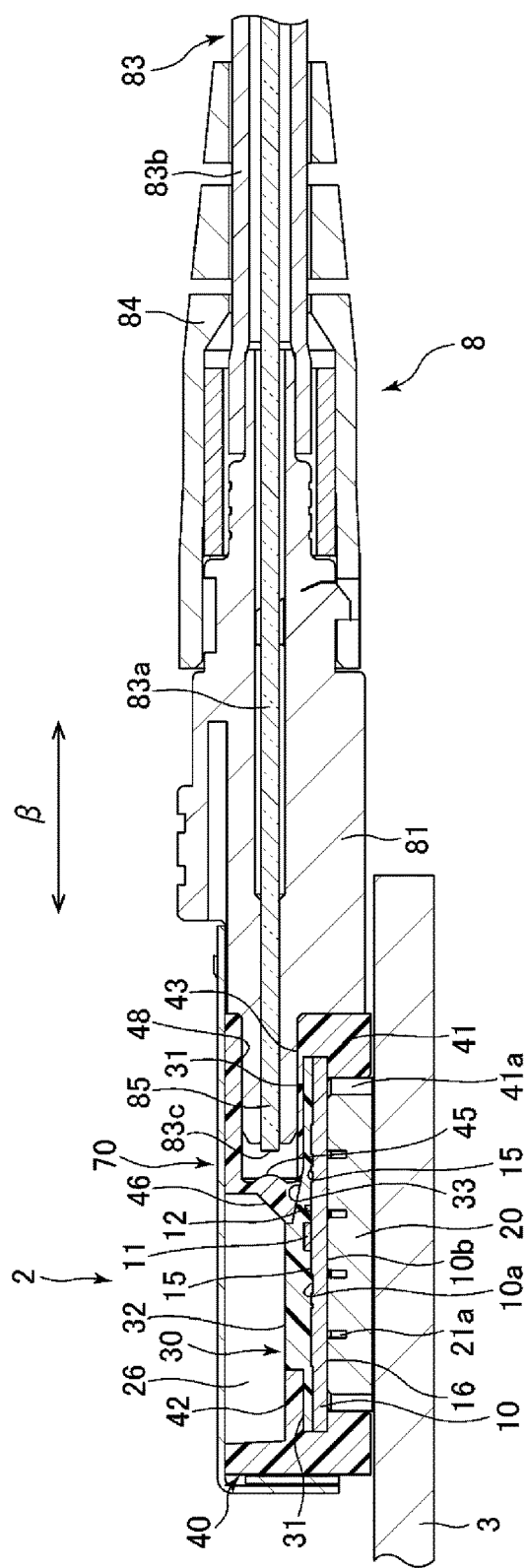
FIG. 5 illustrates a central cross-sectional view illustrating a mated state of the counterpart connector and the photoelectric conversion connector device.

FIG. 5 is central cross-sectional view illustrating a mated state of the counterpart connector 8 and the photoelectric conversion connector device 2, taken along the axial line of the fiber-optic cable 83. The fiber-optic wire 83a of the fiber-optic cable 83 not covered by the cover 83b is inserted into the ferrule 85. Inserting this ferrule 85 into the access hole 48 of the photoelectric conversion connector device 2, puts the fiber-optic wire 83a, in particular, its distal end 83c, in a predetermined position in the photoelectric conversion connector device 2. As a result, the fiber-optic wire 83a is positioned facing the lens 45 on the side of the photoelectric conversion connector device 2 and optical signals are transmitted and received between the counterpart connector 8 and the photoelectric conversion connector device 2.

As an example, the discussion below will explain how the photoelectric conversion connector device 2 is used to allow optical signals from the counterpart connector 8 to reach the board 3 as electrical signals. The process by which electrical signals of the board 3 reach the fiber-optic cable 83 as optical signals may be understood by considering this explanation in reverse order.

An optical signal emerging from the distal end 83c of the fiber-optic wire 83a provided in the counterpart connector 8 is first condensed by the lens 45 formed in the resin member 40 and reaches the reflective surface 46 similarly formed in the resin member 40. With the optical path changed by the reflective surface 46, the signal is transmitted through the tapered section 33 provided at the boundary between the resin member 40 and resin member 30 and reaches the optical semiconductor device 12 provided in the support member 30. The electrical signals converted from the optical signals using the optical semiconductor device 12 are transmitted to the board 3 as electrical signals by passing through the wiring pattern 15 provided on the face 10a of the support member 30 to the contact connecting portions 16 provided on the other face 10b and, further, via contact between the contact connecting portions 16 and the resilient contact portions 21a of the contact member 20.

Next, a description will be given of the method of manufacturing the photoelectric conversion connector 1.

Figure 6:
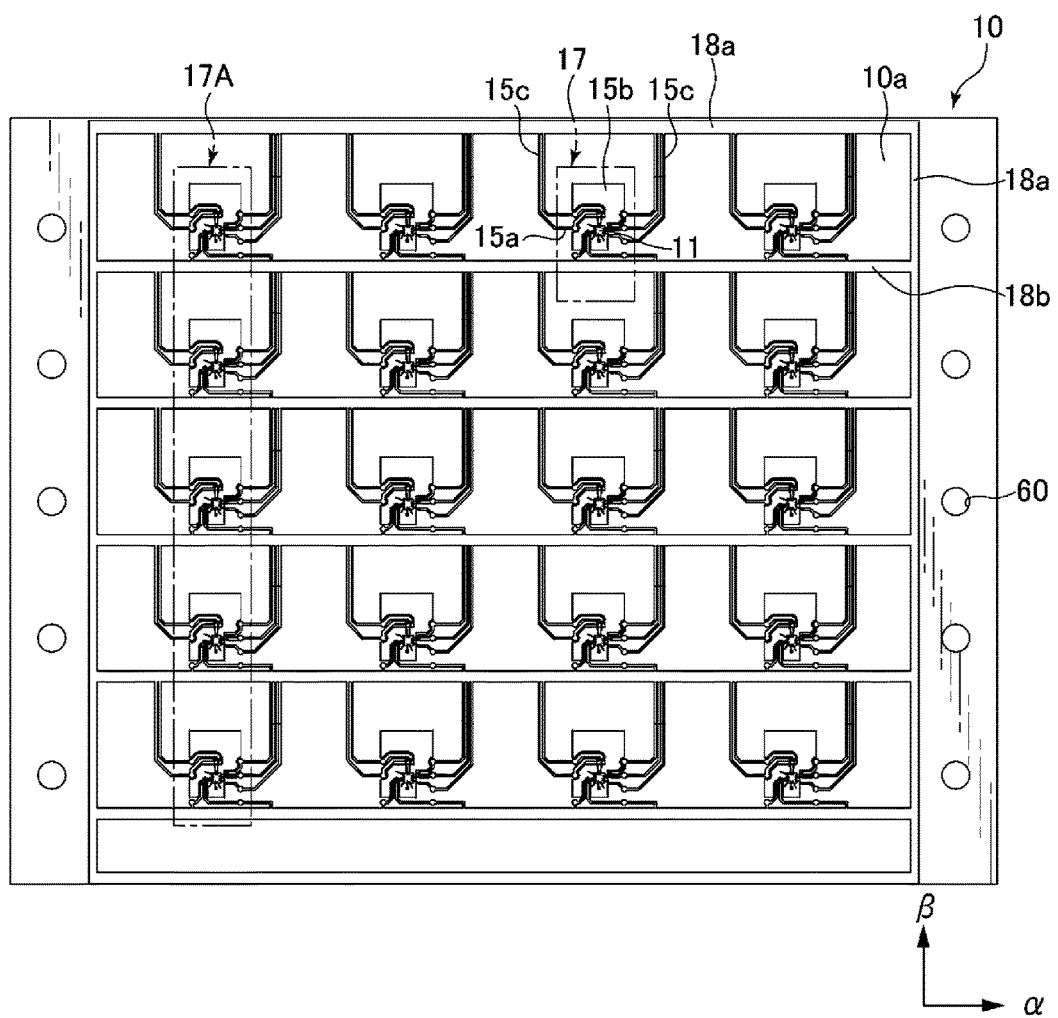
FIG. 6 illustrates a plan view of one side of the support member.
Figure 7:
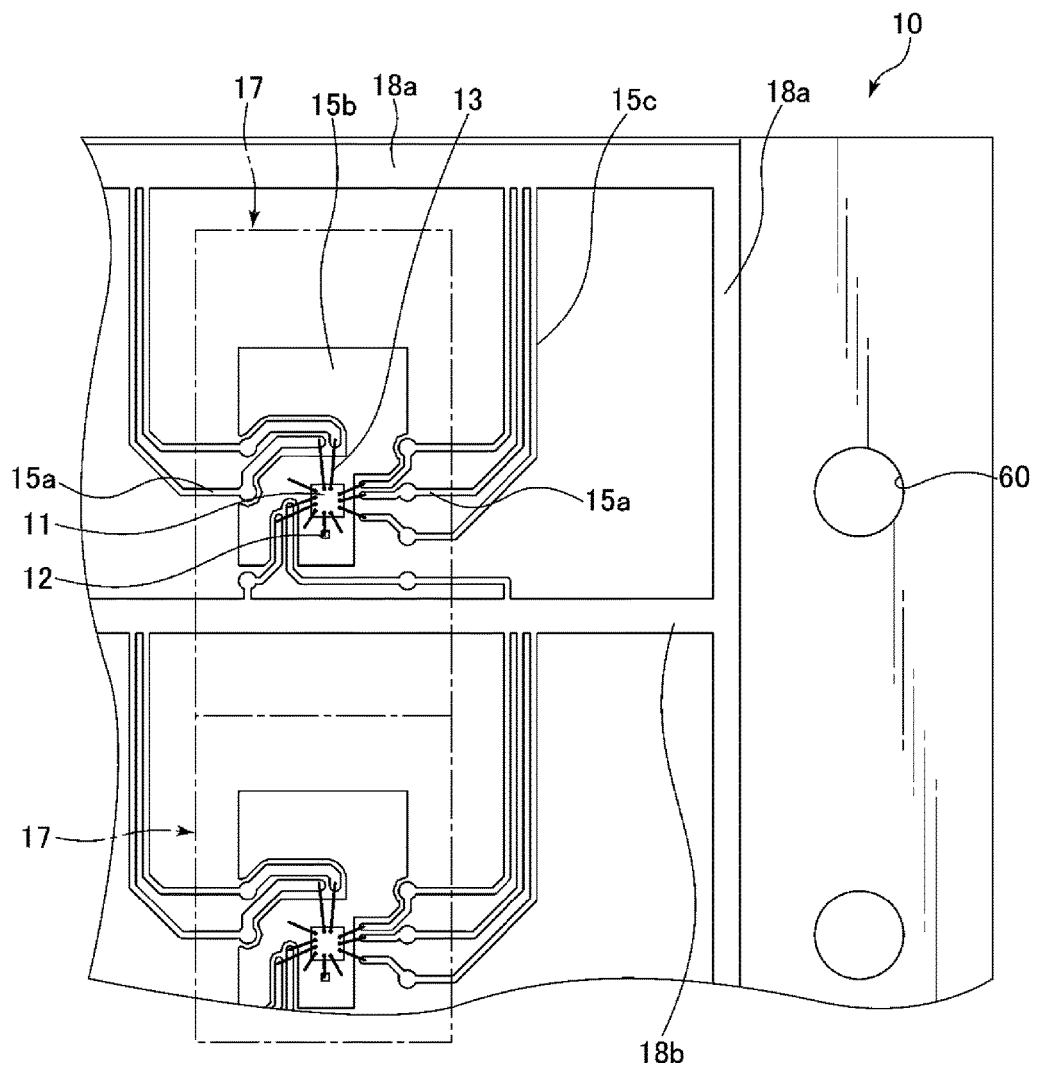
FIG. 7 illustrates a partial enlarged view of FIG. 6.

First of all, the support member 10 is prepared. FIG. 6 shows a plan view of the face 10a of the support member 10, and FIG. 7 shows a partial enlarged view thereof. For example, the support member 10 may be formed as a substrate made of resin or ceramics. On the face 10a of the support member 10, respectively in the row direction (in the direction of arrow α in the figure) and in the column direction (in the direction of arrow β in the figure), there are multiple connector components 17 and their peripheral components are arranged in each direction. All of these connector components 17 and their peripheral components may have substantially the same configuration. As will become apparent from the descriptions below, only the connector components 17 are left in the final product (i.e., the photoelectric conversion connector 1) and the peripheral components are removed. Furthermore, although in this example, there is a total of 20 connector components 17, etc. arranged in a 4×5 matrix, of course, this need not be the case, and multiple connector components, etc. could be included in each row and column. Thus, processing the connector components 17, etc. respectively in the row direction α and in the column direction β in a state in which multiple connector components are arranged in each direction, makes it possible to mass produce multiple photoelectric conversion connectors 1 at one time. Furthermore, while a single connector component 17 is described here as the component used to manufacture a single photoelectric conversion connector 1, this does not need to be the case, and two or more connector components can be used to manufacture a single photoelectric conversion connector 1.

The wiring patterns 15, 18 can be provided using metal plating, printing, and other methods. The wiring patterns include linear wiring patterns 15a and 15c, island-shaped wiring patterns 15b, and furthermore, a coupling wiring pattern 18. The coupling wiring pattern 18 further includes an annular pattern 18a provided in an annular configuration around the outer periphery of the support member 10, in other words, in the row direction "α" and in the column direction "β", and row patterns 18b provided in the row unit-delimiting sections in the row direction α. At least some or all of the wiring patterns among these wiring patterns are electrically connected immediately prior to the subsequent dicing step. For instance, in the examples of FIG. 6 and FIG. 7, the wiring patterns other than the island-shaped wiring patterns 15b (i.e., the patterns 15a, 18a, and 18b) are all electrically connected immediately prior to the subsequent dicing step. As a result, according to the inventive manufacturing method, in connection with the hereinafter-explained dicing step, a portion of the wiring patterns 15, 18, (e.g., the wiring patterns 15a and 18b) are exposed on at least a portion of the circumferential faces formed by the support member 10 and resin member 30 (e.g., the lateral end faces 10c and 30c formed by the support member 10 and resin member 30; see (b) in FIG. 2 and FIG. 3).

The linear wiring patterns 15a, island-shaped wiring patterns 15b, and furthermore, some of the row patterns 18b are the only portions of the wiring patterns 15, 18 that are included in the connector components 17. Other wiring patterns, namely, the linear wiring patterns 15c, the annular patterns 18a, and the rest of the row patterns 18b are merely peripheral components of the connector components 17, and are removed from the final product (i.e., the photoelectric conversion connector 1).

Circuit elements, such as optical semiconductor devices 12, actuation devices 11, and the like, are secured to the island-shaped wiring patterns 15b using adhesive agents and the like. The circuit elements and the wiring patterns other than the island-shaped wiring patterns 15b can be electrically connected by means of bonding wires 13 connected between the optical semiconductor device 12 and the actuation device 11.

Figure 8:
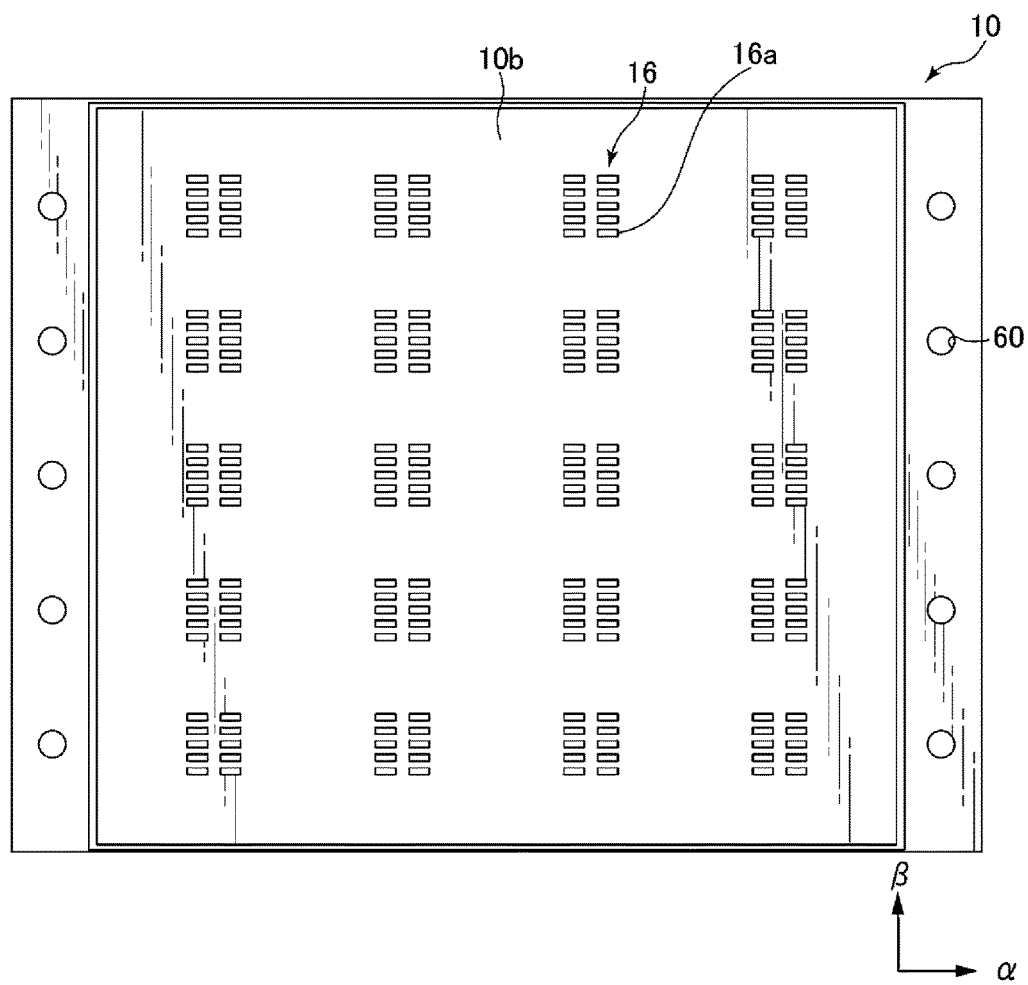
FIG. 8 illustrates a plan view of the other side of the support member.

FIG. 8 shows a plan view of the other face 10b of the support member 10. Multiple contact connecting portions 16 are arranged on the other face 10b of the support member 10 in each direction, respectively, in the row direction α and in the column direction β, in the same manner as the connector components 17, and, in addition, so as to correspond to the connector components 17. The contact connecting portions 16 may include multiple pads 16a designed to correspond to the multiple contacts 21 provided in the contact member 20 (see FIG. 2, etc.). Although not apparent from the drawings, each one of these pads 16a is connected to a corresponding wiring pattern 15a through the support member 10 using vias and the like.

As can be seen from FIG. 6 and FIG. 8, at least two openings 60 mutually spaced apart in the row direction α are provided in the support member 10. Using these openings 60 makes it possible to determine the encapsulation position of the resin member 20 and the molding position of the resin member 40 relative to the support member 10, thereby simplifying the manufacturing process. In particular, this configuration can be considered suitable for machine production because the support member 10 can be transported using these openings 60 during machine production.

Figure 9:
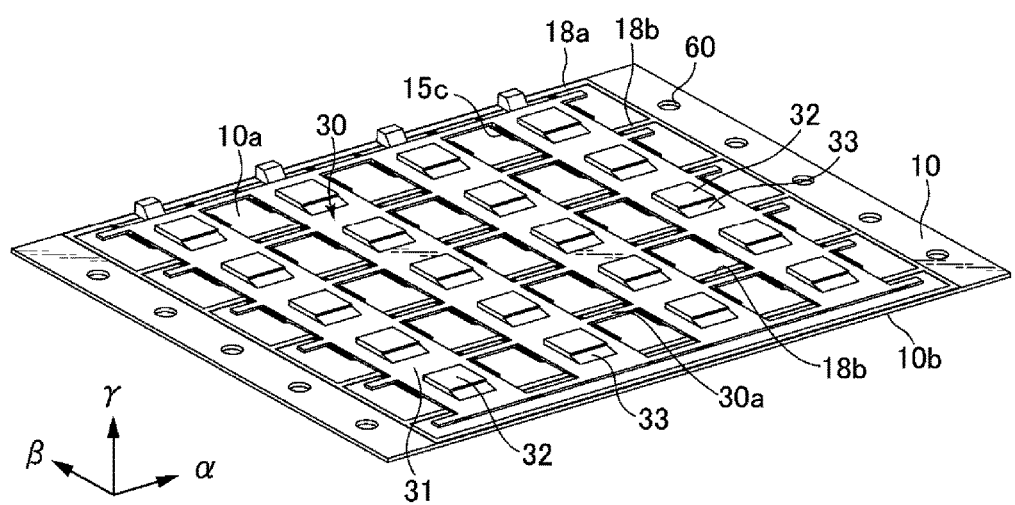
FIG. 9 illustrates an oblique view illustrating the state of the support member after encapsulation.
Figure 10:
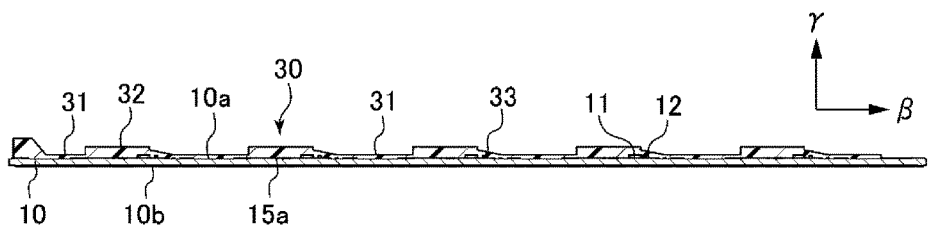
FIG. 10 illustrates a centerline cross-sectional view of a series of connector components aligned in the column direction after encapsulation.

Next, the connector components 17 and at least some of its peripheral components 15c, 18a are encapsulated by molding the resin member 30 onto the face 10a of the support member 10. FIG. 9 shows the state of the support member 10 after encapsulation in an oblique view. Encapsulation with the resin member 30 is carried out in a state in which a series of connector components 17A arranged in the column direction β are substantially isolated from connector components 17 adjacent to said series of connector components 17A in the row direction α. FIG. 10 shows a centerline cross-sectional view, taken in the column direction "β", of a series of connector components 17A encapsulated by the resin member 30. For example, if a thermosetting resin is used for the resin member 30, warping in the support member 10 may occur upon cooling of the resin due to its coefficient of contraction. In particular, when a series of connector components 17A arranged in the column direction "β" are encapsulated along with connector components 17 adjacent to said series of connector components 17A in the row direction α, as in this configuration, the risk of warping is very high because of the size. However, as a result of encapsulation in a state in which a series of connector components 17A arranged in the column direction α are substantially isolated from connector components 17 adjacent to said series of connector components 17A in the row direction α, as in this configuration, the likelihood of generating warping or the magnitude of the resultant warping can be reduced. Furthermore, as used herein, the term "substantially" means that a series of connector components 17A and connector components 17 adjacent to said series of connector components 17A in the row direction α do not need to be completely isolated and, for example, may be coupled in portion 30a. Even if some warping does occur as a result of coupling, there is no substantial problem if the warping is such that adverse effects do not occur in the subsequent dicing process and the like and, additionally, so long as the effects that the present invention intends to provide do not disappear. Therefore, they do not necessarily have to be completely isolated. As discussed below, providing the coupling portion 30a may sometimes bring about novel effects.

Encapsulation with the resin member 30 is preferably performed by encapsulating not only a series of connector components 17A, but both this series of connector components 17A and all the connector components adjacent to this series of connector components 17A in the row direction α at one time. Encapsulating all the connector components adjacent in the row direction "α" at one time can ensure a more efficient manufacturing process.

In addition to the connector components 17, encapsulation with the resin member 30 is preferably performed also with respect to the peripheral components of these connector components 17, for example, with respect to peripheral components such as the wiring patterns 15c, which are located between a series of connector components 17A and connector components 17 adjacent to this series of connector components 17A in the row direction α and which are not included among the connector components 17. Covering the peripheral components of the wiring pattern 15c, which are not among the connector components 17, with the resin member 30 can reduce the risk that wiring patterns that are connector components 17, namely, linear wiring patterns 15a, island-shaped wiring patterns 15b, and some of the row patterns 18b will be peeled off the support member 10 along with peripheral components such as the wiring patterns 15c when the support member 10 is diced, etc.

It is preferable to use a thermosetting resin for the resin member 30. Using a thermosetting resin makes it possible to use transfer molding. Although transfer molding using a thermosetting resin is believed to be unsuitable for mass production because it requires more time than injection molding and the like, it can reduce the load applied to the connector components 17 during encapsulation and, for this reason, can effectively prevent breakage of circuit elements and bonding wires.

Figure 11:
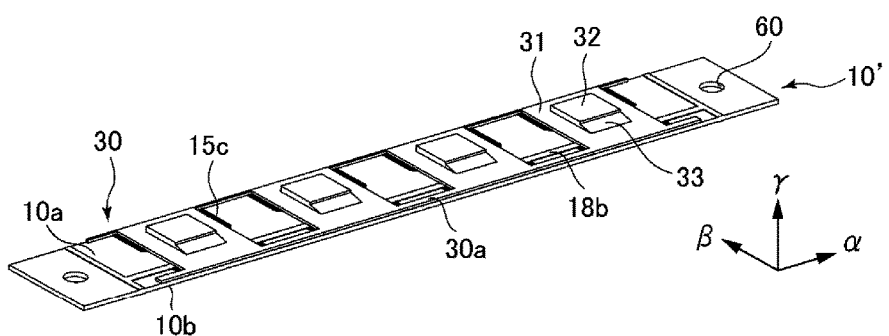
FIG. 11 illustrates an oblique view illustrating the state of the support member after dicing.

Subsequent to the step of encapsulation with the resin member 30, the connector components 17 encapsulated using the resin member 30 are diced into row units in the row direction α. FIG. 11 is an oblique view of the state of the support member 10' after dicing. The dicing is preferably performed above the coupling portion 30a, namely, the portion 30a that couples a series of connector components 17A and connector components 17 adjacent to this series of connector components 17A in the row direction α. This makes it possible to reduce the risk that the wiring pattern 15a will peel off the support member 10 if warping occurs during the molding of the resin member 30. Furthermore, even after dicing the support member 10 into row units, an opening 60 remains in each of the support members 10' produced by dicing. This makes it easier to work with each support member 10' produced by dicing.

Figure 12A:
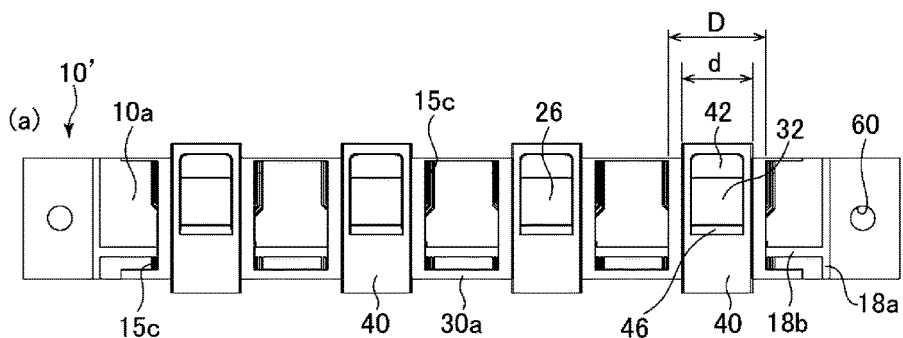
FIGS. 12(a) and 12(b) illustrate the state of the support member subsequent to molding with a resin member.
Figure 12B:
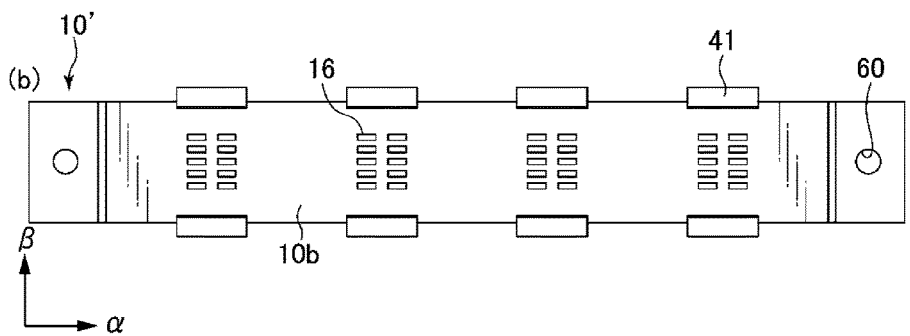
Figure 13:
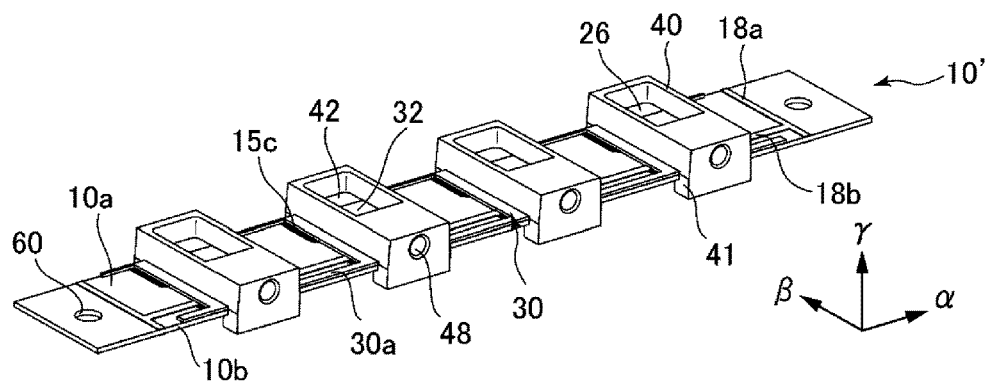
FIG. 13 illustrates an oblique view of the state illustrated in FIGS. 12(a) and 12(b).

After the dicing step, the multiple connector components 17 located on the support member 10 that have been encapsulated using the resin member 30 and diced are subjected to molding using the resin member 40 on a column-by-column basis. FIG. 12(a) is a plan view illustrating the state of the support member 10 subsequent to molding with the resin member 40, FIG. 12(b) is a view of its bottom face, and FIG. 13 is an oblique view thereof. As shown in FIG. 12(a), the width d of the resin member 40 in the row direction α is set to be slightly smaller than the width D of the resin member 30 in the same direction. Unlike the resin member 30, the resin member 40 is integrally molded using injection molding. Integral molding can simplify the manufacturing process and, in addition can increase the strength of the manufactured connectors. However, the thick layer section 32 of the resin member 30 is not molded using the resin member 40. The purpose is to avoid adverse effects produced by injection pressure on the circuit elements encapsulated in the thick layer section 32, such as the optical semiconductor device 11, etc., during the molding of the resin member 40 (see FIG. 4, etc.). As a result, a space 26 is formed above the thick layer section 32. On the other hand, portions 42 and 43 of the resin member 40 are molded on top of the thin layer section 31 of the resin member 30, thereby firmly securing the resin member 40 to the resin member 30.

Finally, the multiple connector components 17 located on the support member 10, onto which the resin member 40 has been molded, are diced off one-by-one in the column direction β. The dicing location is between the width D of the resin member 30 and the width d of the resin member 40 shown in FIG. 12(*a*). This can effectively prevent problems such as peeling of the wiring patterns and the like.

Upon accomplishing the steps above, the manufacture of the photoelectric conversion connector 1 shown in FIG. 2 and FIG. 4, etc., is completed. A photoelectric conversion connector device 2 (see FIG. 2, etc.) can be obtained by attaching a contact member 20 to this photoelectric conversion connector 1. A shell 70 may also be attached to this photoelectric conversion connector device 2.

Variations of the inventive photoelectric conversion connector will now be described with reference to FIGS. 14-18. In the embodiment illustrated in FIG. 1, etc., a single optical semiconductor device was provided in one photoelectric conversion connector. However, in this variation, multi-conductor bidirectional communication is made possible by providing multiple optical semiconductor devices in a single photoelectric conversion connector. In this variation, in particular, dual-conductor bidirectional communication is made possible by providing two optical semiconductor devices 14 and 19. In addition, in this variation, the wiring patterns are different from those of FIG. 1.

Figure 14:
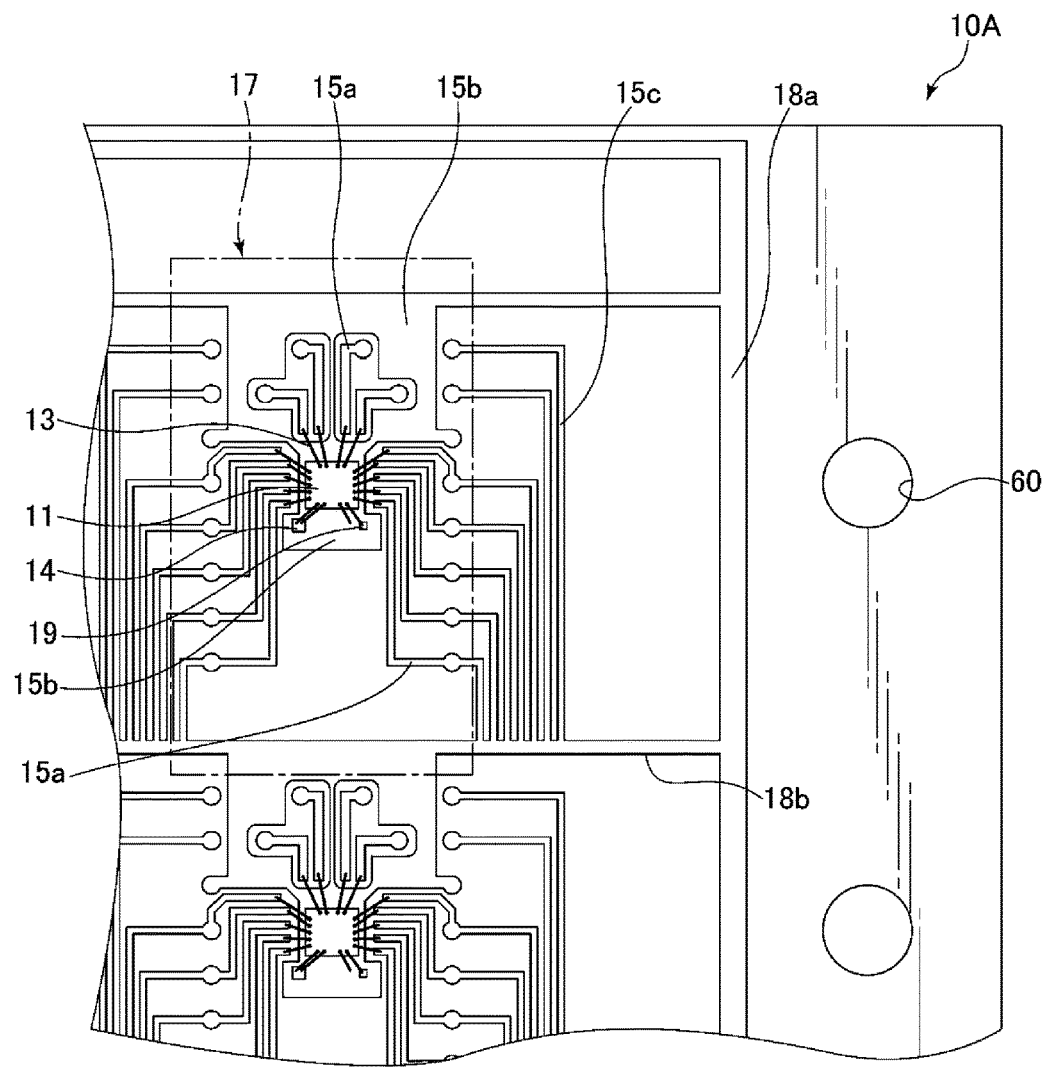
FIG. 14 illustrates a partial enlarged view of one side of the support member in a variation.
Figure 15A:
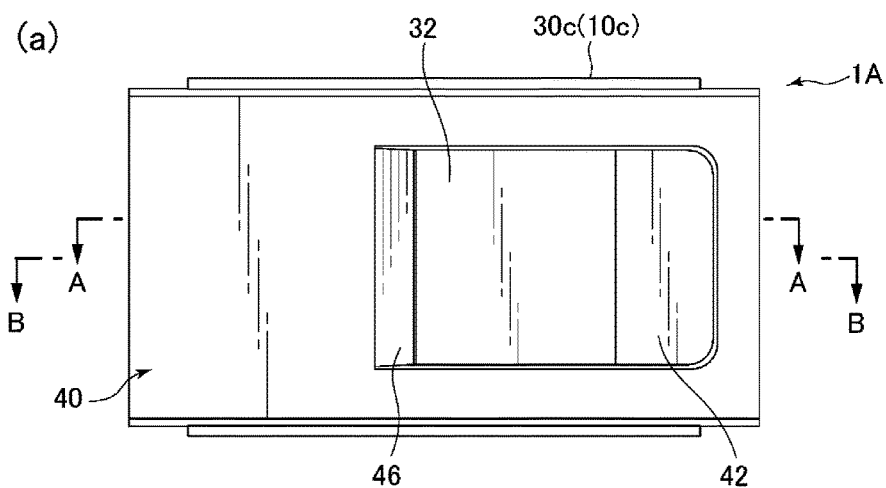
FIGS. 15(a) to 15(c) illustrates a photoelectric conversion connector in a variation.
Figure 15B:
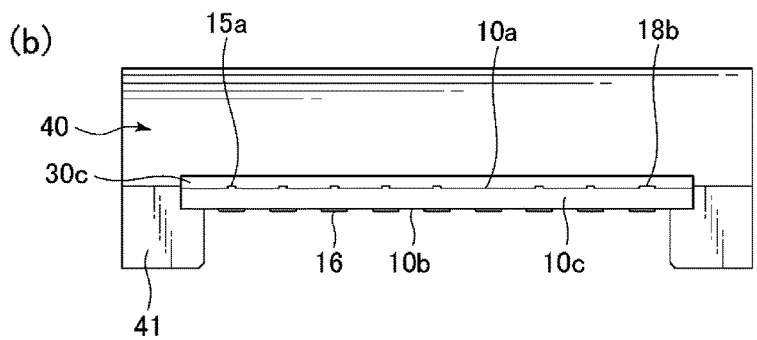
Figure 15C:
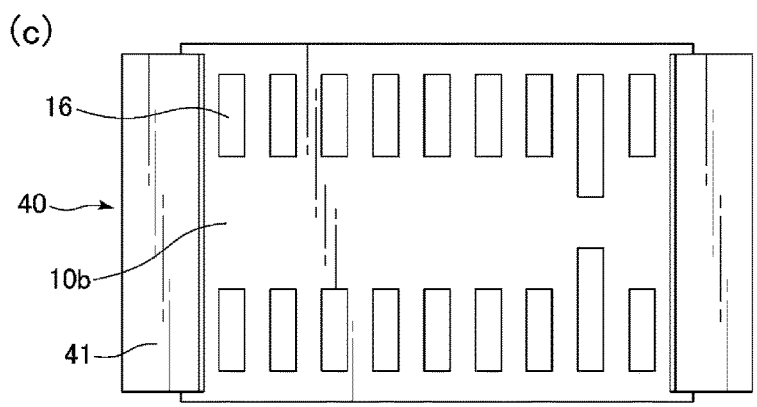
Figure 16:
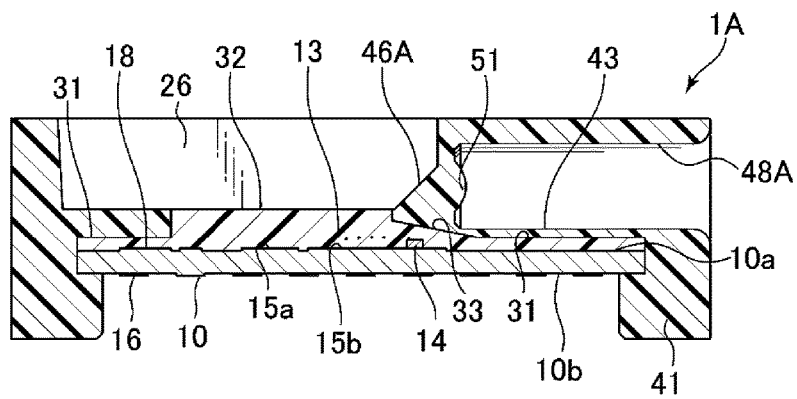
FIG. 16 illustrates a cross-sectional view taken along line A-A in FIG. 15(a).
Figure 17:
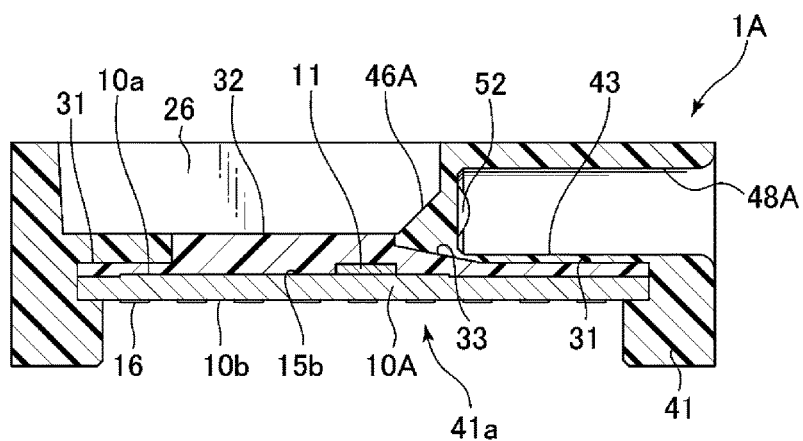
FIG. 17 illustrates a cross-sectional view taken along line B-B in FIG. 15(a).
Figure 18:
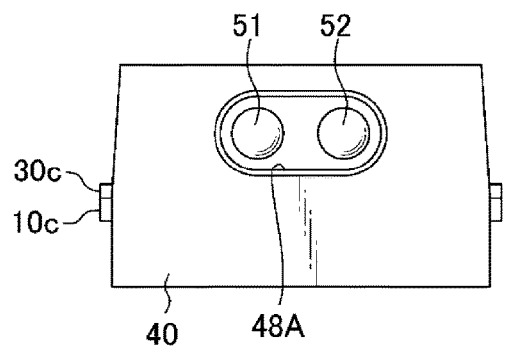
FIG. 18 illustrates a lateral face view of a photoelectric conversion connector in a variation.

FIG. 14 corresponds to FIG. 7 of the previous embodiment, namely, to a partial enlarged view of one side of the support member, FIG. 15(*a*) corresponds to the FIG. 3(*a*), namely, to a plan view of the photoelectric conversion connector, FIG. 15(*b*) corresponds to FIG. 3(*b*), namely, to a front view of the photoelectric conversion connector, and FIG. 15(*c*) corresponds to FIG. 3(*c*), namely, to a view of the bottom face of the photoelectric conversion connector. FIG. 16 shows a cross-sectional view taken along line A-A in FIG. 15(*a*), FIG. 17 shows a cross-sectional view taken along line B-B in the same figure, and FIG. 18 shows a lateral face view of the photoelectric conversion connector according to the variation. Furthermore, the same reference numerals are used for members identical to the members used in the embodiment illustrated in FIG. 1, etc., and the character "A" is added if necessary. Details that are not explained here should be considered similar to the embodiment illustrated in FIG. 1, etc.

As shown in FIG. 14, one optical semiconductor device 14 used for reception and one optical semiconductor device 19 used for transmission are provided on the support member 10A used in this photoelectric conversion connector 1A. As shown in FIGS. 16-18, a lens used for transmission 51 and a lens used for reception 52 are disposed in parallel to each other in a matching configuration. An access hole 48A is formed in an elliptic configuration expanded in the width direction in order to accommodate both a transmitting fiber-optic cable of a counterpart connector and a receiving fiber-optic cable. A reflective surface 46A, which is disposed to face lenses 51 and 52 is formed in the same manner, and can be used both for transmitting and receiving. In this manner, providing multiple optical semiconductor devices makes it possible to handle multi-conductor bidirectional communication. In addition, as shown in FIG. 15, in the photoelectric conversion connector 1A, in view of the dicing step, a portion of the wiring patterns 15, 18, for example, the wiring patterns 15*a* and 18*b* are exposed on at least some of the circumferential faces formed by the support member 10 and resin member 30, for example, on the lateral end faces 10*c* and 30*c*.

Furthermore, the present invention is not limited to the above-described embodiments, and various other changes are possible. Therefore, the drawings and specifications are merely illustrative, and the invention is not limited thereto.

For example, the shape of the resin member 40 is not limited to the shape disclosed in the embodiments and various shapes can be used. As an example, the access hole 48 used to support the ferrule 85 may be shaped to securely support a fiber and may have formed therein a matable mating portion that permits connection/disconnection from the contact member 20. Therefore, the inventive manufacturing method can be applied to resin members 40 of various shapes and to photoelectric conversion connectors of various types.

In addition, the wiring patterns 15, 18 are not limited to the patterns disclosed in the embodiments and, depending on the situation, can assume various shapes. The locations where the wiring patterns are exposed need not be limited to the lateral end faces 10*c* and 30*c*. As will be apparent from the Specification above, all of at least some of the wiring patterns are electrically connected until immediately before the subsequent dicing step. As a result, after the dicing step, at least a portion thereof will be necessarily exposed on at least a portion of the circumferential faces formed by the support member 10 and resin member 30. In this case, depending on the shape of the wiring pattern, the wiring pattern may be exposed not on the lateral end faces, but, for example, on the end faces in the fore-and-aft direction. Therefore, the locations where the wiring patterns are exposed will occupy at least a portion of the circumferential faces formed by the support member 10 and resin member 30 and are not limited to the lateral end faces. Furthermore, the sections where the wiring patterns are exposed may be covered by the resin member 40. However, they do not need to be covered.

DESCRIPTION OF THE REFERENCE NUMERALS

1 Photoelectric conversion connector
2 Photoelectric conversion connector device
8 Counterpart connector
10 Support member
10*c* Lateral face
11 Actuation device
12 Optical semiconductor device
13 Bonding wire
15 Wiring pattern
16 Contact connecting portion
17 Connector components
18 Wiring pattern
20 Contact member
21 Contact
30 First resin member
30*a* Coupling portion
30*c* Lateral face
40 Second resin member
45 Lens
46 Reflective surface
48 Access hole
51 Lens
52 Lens
60 Locating opening
70 Shell
83 Fiber-optic cable
83*a* Fiber-optic wire
83*c* Distal end

The invention claimed is:

1. A method of manufacturing photoelectric conversion connectors comprising:

encapsulating a series of connector components arranged in a column direction among multiple connector components on a support member that are arranged in each direction, respectively, in a row direction and in a column direction, in a state of substantial isolation from connector components adjacent to said series of connector components in the row direction using a first resin member;

dicing the multiple connector components on the support member encapsulated using the above-mentioned first resin member into row units in the row direction;

molding the multiple connector components on the support member, which have been encapsulated using the above-mentioned first resin member and diced, using a second resin member on a column-by-column basis; and dicing off the multiple molded connector components on the support member in the column direction one by one.

2. The method of manufacturing photoelectric conversion connectors according to claim 1, wherein the encapsulation step is performed by encapsulating, at one time, the series of connector components and connector components adjacent to said series of connector components in the row direction using the first resin member.

3. The method of manufacturing photoelectric conversion connectors according to claim 1, wherein the first resin member is a thermosetting resin.

4. The method of manufacturing photoelectric conversion connectors according to claim 1, wherein encapsulation with the first resin member is performed using transfer molding.

5. The method of manufacturing photoelectric conversion connectors according to claim 1, wherein the second resin member is integrally molded.

6. The method of manufacturing photoelectric conversion connectors according to claim 1, wherein encapsulation with the first resin member is also performed with respect to peripheral components, which are located between the series of connector components arranged in the column direction and connector components adjacent to said series of connector components in the row direction and which are not included among said connector components.

7. The method of manufacturing photoelectric conversion connectors according to claim 1, wherein at least two openings mutually spaced apart in the row direction are provided in the support member.

8. The method of manufacturing photoelectric conversion connectors according claim 7, wherein the at least two openings are included in each respective support member produced by dicing into row units in the row direction.

* * * * *